(12) United States Patent
Abidin et al.

(10) Patent No.: US 6,819,172 B2
(45) Date of Patent: Nov. 16, 2004

(54) DC OFFSET CANCELLATION TECHNIQUES

(75) Inventors: Cindra Widya Abidin, West Los Angeles, CA (US); Georgios S. Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 10/318,630

(22) Filed: Dec. 13, 2002

(65) Prior Publication Data

US 2004/0113685 A1 Jun. 17, 2004

(51) Int. Cl.[7] .............................. H03F 1/36; H03F 1/02
(52) U.S. Cl. ............................................ 330/85; 330/9

(58) Field of Search ................................. 330/85, 9, 11, 330/69; 327/307

(56) References Cited

U.S. PATENT DOCUMENTS

| 4,227,155 A | * | 10/1980 | Lerma .......................... 330/11 |
| 4,374,362 A | * | 2/1983 | Sutherland et al. ......... 327/307 |
| 5,059,918 A | * | 10/1991 | Brahms et al. ............... 330/11 |
| 6,429,697 B1 | * | 8/2002 | Amazeen et al. ............. 327/87 |

* cited by examiner

Primary Examiner—Patricia Nguyen
(74) Attorney, Agent, or Firm—Glen B. Choi

(57) ABSTRACT

The present invention includes an offset cancellation device having input return loss characteristics suitable for high frequency operation.

19 Claims, 4 Drawing Sheets

DC OFFSET CANCELLATION TECHNIQUES

FIELD

The subject matter disclosed herein generally relates to DC offset cancellation devices.

DESCRIPTION OF RELATED ART

FIG. 1 depicts a conventional wide band amplifier that includes a DC offset cancellation circuit 100 and voltage amplifier 105. DC offset cancellation circuit 100 may include transconductive amplifier 102-B and input termination resistors 110. Voltage amplifier 105 may include a transconductive amplifier 102-A and loads 120.

Input return loss measures how much power loss occurs for an increment of incident power. An input return loss value is defined mathematically as $-20*\log_{10}(S_{11})$, where $S_{11}$ represents a ratio of (a) power reflected from input terminals to (b) power incident to such input terminals. The DC offset cancellation circuit 100 of FIG. 1 may have an $S_{11}$ value represented by the following relationship:

$(Z_{in}-R)/(Z_{in}+R)$, where $Z_{in}$ is the input impedance of the DC offset cancellation circuit 100 (as measured from terminal INPUT), and R is the resistance of a single ended resistor 110 measured with respect to AC ground.

The input impedance, $Z_{in}$, may be equivalent to a single resistor 110 in parallel with an input capacitance of amplifier 102-A and in parallel output capacitance of amplifier 102-B. As the frequency of an input signal to terminal INPUT increases, the input impedance, $Z_{in}$, decreases. Consequently, input return loss may increase with increasing frequency. Therefore, DC offset cancellation circuit 100 may have an undesirable impact on input return loss performance for high frequency input signals.

BRIEF DESCRIPTION OF THE DRAWINGS

Note that use of the same reference numbers in different figures indicates the same or like elements.

DETAILED DESCRIPTION

Figure 2:
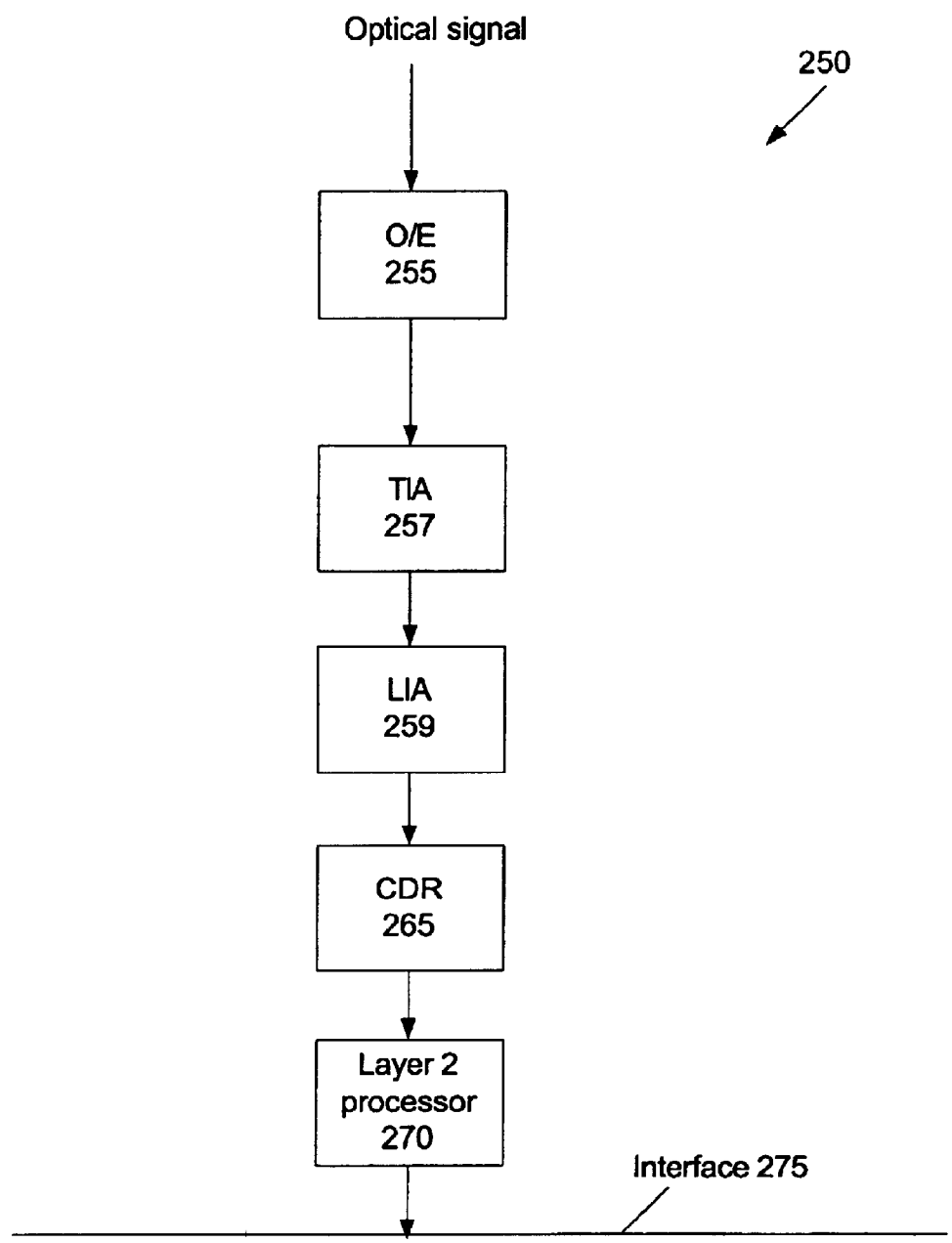
FIG. 2 depicts a suitable receiver system in which some embodiments of the present invention may be used.

FIG. 2 depicts a suitable receiver system 250 in which some embodiments of the present invention may be used. Receiver 250 may receive signals encoded in compliance for example with optical transport network (OTN), Synchronous Optical Network (SONET), and/or Synchronous Digital Hierarchy (SDH) standards. Example optical networking standards may be described in ITU-T Recommendation G.709 Interfaces for the optical transport network (OTN) (2001); ANSI T1.105, Synchronous Optical Network (SONET) Basic Description Including Multiplex Structures, Rates, and Formats; Bellcore Generic Requirements, GR-253-CORE, Synchronous Optical Network (SONET) Transport Systems: Common Generic Criteria (A Module of TSGR, FR-440), Issue 1, December 1994; ITU Recommendation G.872, Architecture of Optical Transport Networks, 1999; ITU Recommendation G.825, "Control of Jitter and Wander within Digital Networks Based on SDH" March, 1993; ITU Recommendation G.957, "Optical Interfaces for Equipment and Systems Relating to SDH", July, 1995; ITU Recommendation G.958, Digital Line Systems based on SDH for use on Optical Fibre Cables, November, 1994; and/or ITU-T Recommendation G.707, Network Node Interface for the Synchronous Digital Hierarchy (SDH) (1996).

Referring to FIG. 2, optical-to-electrical converter ("O/E") 255 may convert optical signals received from an optical network into electrical signals. Although reference has been made to optical signals, the receiver 250 may, in addition or alternatively, receive electrical signals from an electrical signal network or wireless or wire-line signals according to any standards. Transimpedance amplifier ("TIA") 257 may receive a small amplitude input current and provide a small amplitude output voltage. Limiting amplifier ("LIA") 259 may receive a small amplitude input voltage from the TIA 257 and may output a larger amplitude voltage signal. Some embodiments of the present invention may be used with LIA 259.

Clock and data recovery unit ("CDR") 265 may re-time the electrical signals from LIA 259. With respect to the regenerated signals from CDR 265, layer two processor 270 may perform media access control (MAC) management in compliance for example with Ethernet, described for example in versions of IEEE 802.3; optical transport network (OTN) de-framing and de-wrapping in compliance for example with ITU-T G.709; forward error correction (FBC) processing, in accordance with ITU-T G.975; and/or other layer 2 processing.

Some implementations of receiver system 250 may utilize may utilize 10 Gigabit Attachment Unit Interface (XAUI), Serial Peripheral Interface (SPI), ten bit interface (TBI), and/or Gigabit Media Independent Interface (GMII) compliant interfaces (as well as interfaces based on related standards) to provide intercommunication between layer two processor 270 and the CDR 265.

Interface 275 may provide intercommunication between layer two processor 270 and other devices such as a microprocessor, memory devices (not depicted), packet processor (not depicted), and/or a switch fabric (not depicted). Interface 275 may comply, for example, with Peripheral Component Interconnect (PCI), Universal Serial Bus (USB), Ethernet, IEEE 1394, and/or a vendor specific multi-source agreement (MSA) protocol.

Figure 3:
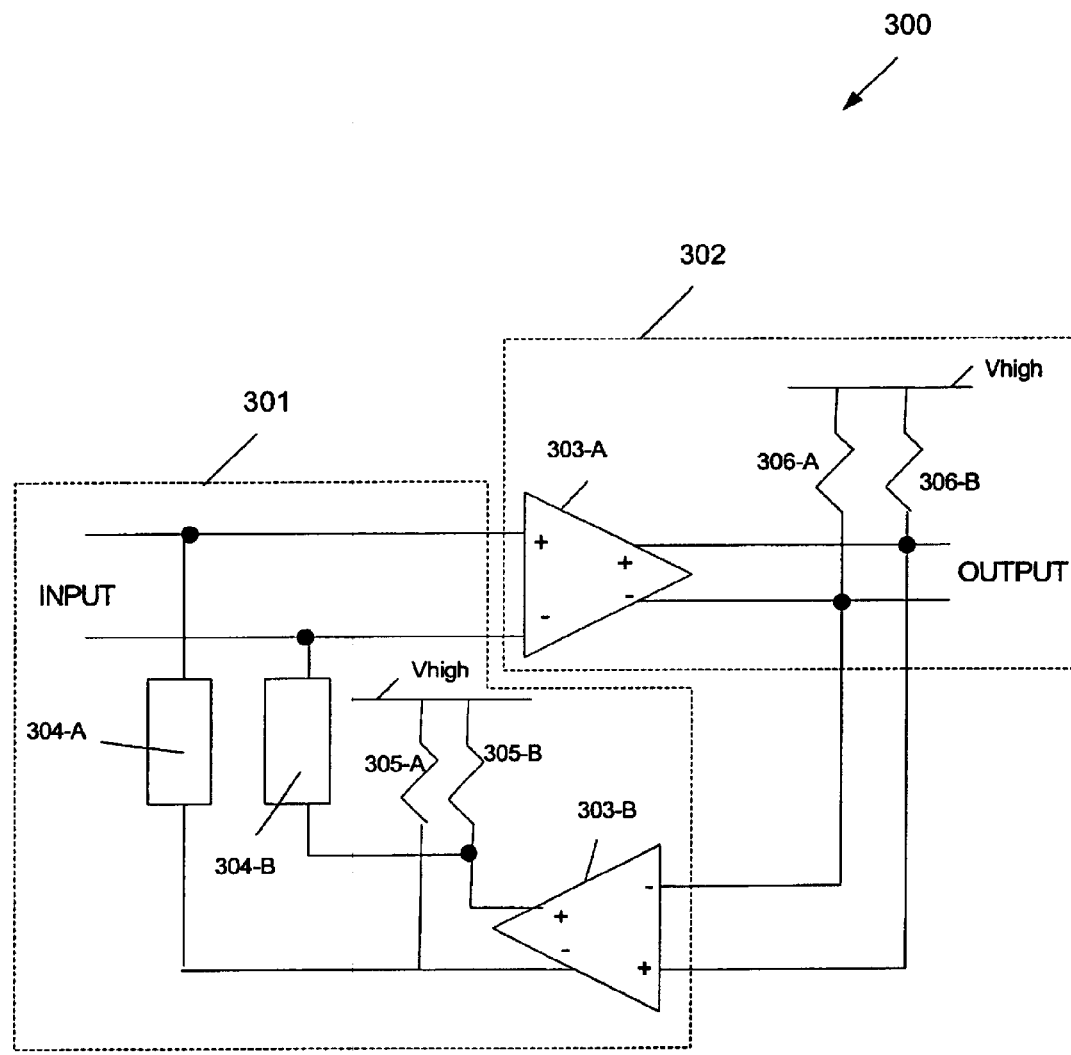
FIG. 3 depicts an offset cancellation circuit in accordance with an embodiment of the present invention.

FIG. 3 depicts an embodiment of the present invention in limiting amplifier 300. Limiting amplifier 300 may include offset cancellation device 301 and voltage amplifier 302. The input return loss characteristics of limiting amplifier 300 at high frequencies of an input signal may be improved over those of conventional DC offset cancellation circuit 100 of FIG. 1. In one implementation, for increasing frequencies of an input signal, the input impedance of offset cancellation device 301 (as measured from terminal INPUT) may not degrade as quickly as the input impedance of the DC offset cancellation circuit 100. Consequently, offset cancellation device 301 may have a more efficient input return loss characteristic than that of the DC offset cancellation circuit 100 of FIG. 1.

One implementation of offset cancellation device 301 may include amplifier 303-B, impedance elements 304-A and 304-B, and resistive elements 305-A and 305-B. One implementation of voltage amplifier 302 may include amplifier 303-A as well as resistive elements 306-A and 306-B. In one embodiment, input terminals of amplifier 303-B may sense the output offset of amplifier 303-A. The output offset may be defined as the differential voltage from output terminals of a differential (symmetric) circuit for a zero input voltage. In one embodiment, the output terminals of amplifier 303-B may generate a signal to cancel the output offset of amplifier 303-A. Moreover, the output terminals of amplifier 303-B may also set the DC voltage level of terminal INPUT.

Amplifiers 303-A and 303-B may be implemented as transconductive amplifiers. Input terminals of amplifier 303-A may be coupled to receive an input signal at terminal INPUT. Positive and negative output terminals of amplifier 303-A may be coupled to respective positive and negative input terminals of amplifier 303-B.

Resistive elements 306-A and 306-B may couple a positive or "high" supply voltage (shown as $V_{high}$) to respective negative and positive output terminals of amplifier 303-A as well as respective negative and positive input terminals to amplifier 303-B.

Resistive element 305-B may couple a positive or "high" supply voltage (shown as $V_{high}$) to the positive output terminal of amplifier 303-B. Impedance element 304-B may couple the positive output terminal of amplifier 303-B to the negative input terminal of amplifier 303-A.

Resistive element 305-A may couple a positive or "high" supply voltage (shown as $V_{high}$) to the negative output terminal of amplifier 303-B. Impedance element 304-A may couple the negative output terminal of amplifier 303-B to the positive input terminal of amplifier 303-A.

In one implementation, each of impedance elements 304-A and 304-B may be implemented as inductors. However, either or both of impedance elements 304-A and 304-B may be implemented as devices having impedances that increase with increasing frequency of a transferred signal. Impedance elements 304-A and 304-B may have similar inductance values. Resistive elements 305-A, 305-B, 306-A, and 306-B may be implemented as resistors or devices having primarily resistive characteristics. Resistive elements 305-A, 305-B, 306-A, and 306-B may each have similar resistance values. The inductance of impedance elements 304-A and 304-B and resistance of resistive elements 305-A, 305-B, 306-A, and 306-B may be set so to minimize the $S_{11}$ value at approximately the desired maximum operating frequency of an input signal.

At a low frequency, the impedance of impedance elements 304-A and 304-B may be low. Moreover, the impedance of the parasitic element at the input of 303A and at the output of 303B are high. As frequency increases, the impedance of the parasitic element decreases and therefore, the total impedance between the parasitic components and resistive elements 305-A and 305-B decreases. However, the impedance of impedance elements 304-A and 304-B increases. The net effect may be a bandwidth extension for a desired $S_{11}$ value.

Figure 1:
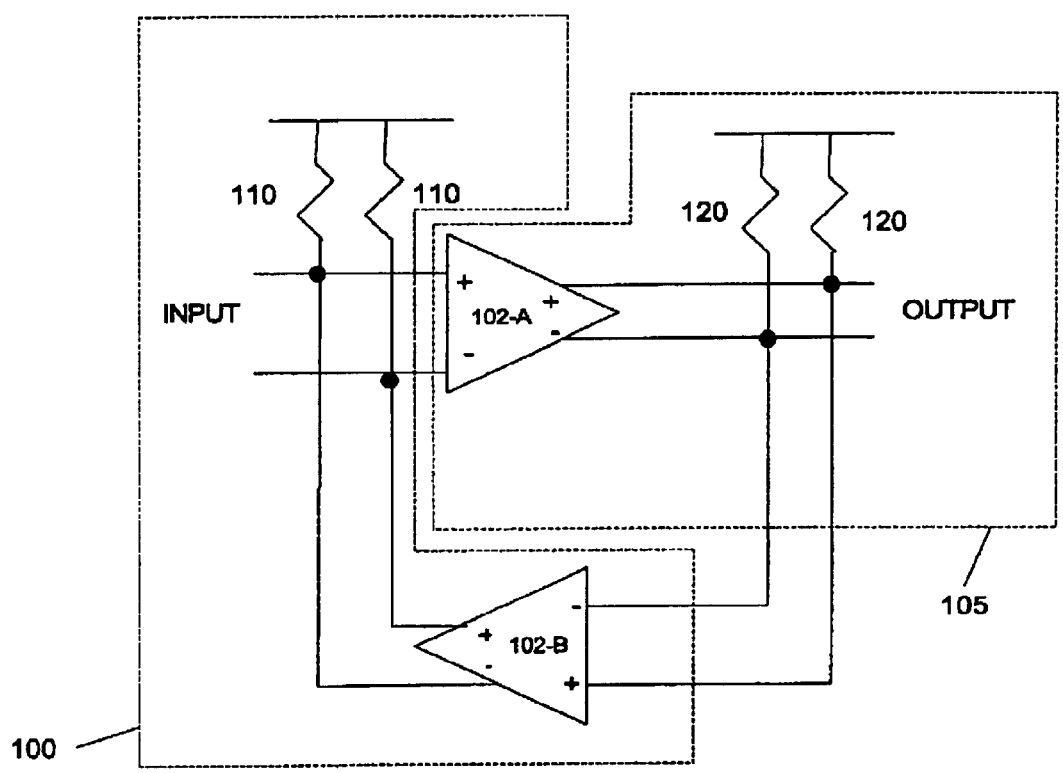
FIG. 1 depicts a conventional wideband voltage amplifier.
Figure 4:
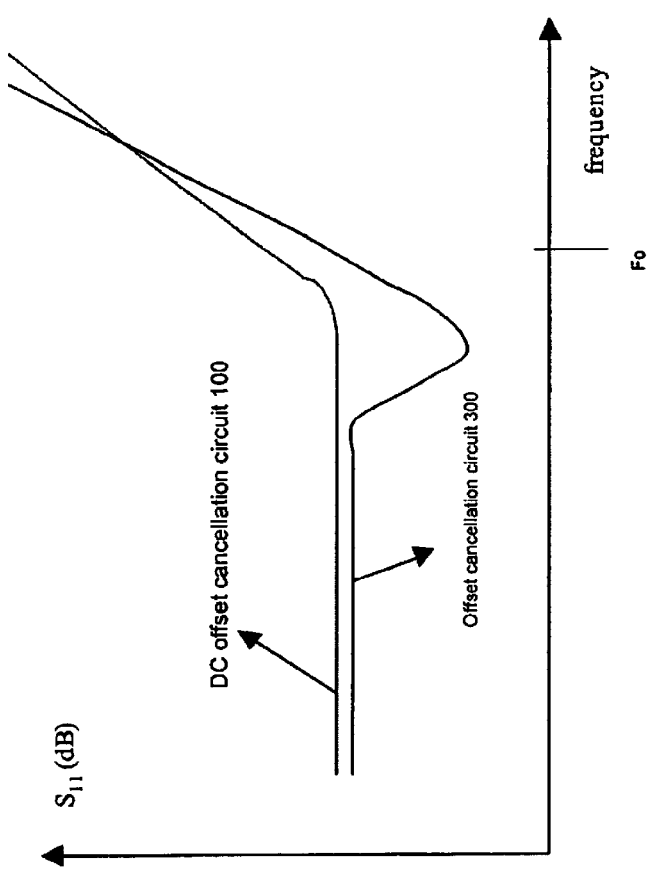
FIG. 4 depicts example $S_{11}$ values for two offset cancellation devices over a range of frequencies of an input signal.

For an input signal having an increasing frequency, FIG. 4 depicts example $S_{11}$ values for both the offset cancellation device 301 of FIG. 3 and the conventional DC offset cancellation circuit 100 of FIG. 1. In this example, the $S_{11}$ values of offset cancellation device 301 are less than those of DC offset cancellation circuit 100. In this example, the $S_{11}$ values of offset cancellation device 301 markedly decrease towards frequency Fo. For example, for broadband applications, the maximum frequency of an input signal may be selected as approximately Fo to minimize power reflection.

Modifications

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
   a signal amplifier comprising:
      a first amplifier to receive an input signal and coupled to a first output load, wherein the first amplifier comprises a transconductive amplifier; and
   an offset cancellation device comprising:
      a second amplifier to receive a signal from the first amplifier and coupled to a second output load and coupled to a third output load, wherein the third output load couples at least one output terminal of the second amplifier to at least one input terminal of first amplifier.

2. The apparatus of claim 1, wherein the first output load comprises at least one resistive element.

3. The apparatus of claim 1, wherein the second amplifier comprises a transconductive amplifier.

4. The apparatus of claim 1, wherein the second output load comprises at least one resistive element.

5. The apparatus of claim 1, wherein the third output load comprises at least one device having an increasing impedance with increasing frequency of the input signal.

6. The apparatus of claim 1, wherein the third output load comprises an inductive element.

7. The apparatus of claim 1, wherein the second output load couples a high supply voltage to output terminals of the second amplifier.

8. The apparatus of claim 1, wherein the first output load couples a high supply voltage to output terminals of the first amplifier.

9. The apparatus of claim 1, wherein the first amplifier includes at least two input terminals and at least two output terminals.

10. The apparatus of claim 9, wherein the second amplifier includes approximately two input terminals and approximately two output terminals and wherein the second amplifier comprises a transconductive amplifier.

11. The apparatus of claim 10, wherein the first output load comprises approximately two resistive elements and wherein the first output load couples a high supply voltage to output terminals of the first amplifier.

12. The apparatus of claim 11, wherein
   the second output load comprises approximately two resistive elements,
   the third output load comprises approximately two inductive elements,
   the second output load couples the high supply voltage to output terminals of the second amplifier, and
   the third output load couples the output terminals of the second amplifier to input terminals of the first amplifier.

13. A system comprising:
   an amplifier to receive an input signal, the amplifier comprising:
      a signal amplifier comprising:
         a first amplifier to receive the input signal and coupled to a first output load, wherein the first amplifier is to provide an output signal and wherein the first amplifier comprises a transconductive amplifier, and an offset cancellation device comprising:

a second amplifier to receive the output signal from the first amplifier and coupled to a second output load and coupled to a third output load, wherein the third output load couples at least one output terminal of the second amplifier to at least one input terminal of first amplifier, a layer two processor to receive the output signal from the amplifier; and an interface device to receive signals from the layer two processor.

14. The system of claim 13, further comprising a XAUI compatible interface to couple the layer two processor with the interface device.

15. The system of claim 13, wherein the layer two processor comprises logic to perform media access control in compliance with IEEE 802.3.

16. The system of claim 13, wherein the layer two processor comprises logic to perform optical transport network de-framing in compliance with ITU-T G.709.

17. The system of claim 13, wherein the layer two processor comprises logic to perform forward error correction processing in compliance with ITU-T G.975.

18. The system of claim 13, further comprising a switch fabric coupled to the interface device.

19. The system of claim 13, further comprising a packet processor coupled to the interface device.

* * * * *

UNITED STATES PATENT AND TRADEMARK OFFICE
CERTIFICATE OF CORRECTION

PATENT NO. : 6,819,172 B2
DATED : November 16, 2004
INVENTOR(S) : Abidin et al.

It is certified that error appears in the above-identified patent and that said Letters Patent is hereby corrected as shown below:

Column 2,
Line 30, delete "(FBC)", and insert -- (FEC) --

Signed and Sealed this

Seventeenth Day of May, 2005

JON W. DUDAS
*Director of the United States Patent and Trademark Office*